(12) United States Patent
Wang et al.

(10) Patent No.: US 8,155,620 B2
(45) Date of Patent: Apr. 10, 2012

(54) METHOD AND APPARATUS FOR ACCOUNTING IN A MOBILE DATA PACKET NETWORK

(75) Inventors: Jun Wang, La Jolla, CA (US); Peerapol Tinnakornsrisuphap, San Diego, CA (US); Raymond Tah-Sheng Hsu, San Diego, CA (US); Fatih Ulupinar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 974 days.

(21) Appl. No.: 12/136,684

(22) Filed: Jun. 10, 2008

(65) Prior Publication Data

US 2008/0310335 A1 Dec. 18, 2008

Related U.S. Application Data

(60) Provisional application No. 60/943,805, filed on Jun. 13, 2007.

(51) Int. Cl.
*G06F 15/16* (2006.01)

(52) U.S. Cl. ........................................ 455/405; 455/445

(58) Field of Classification Search .................. 455/405, 455/410, 411; 370/241, 310, 328, 352; 705/34, 705/40
See application file for complete search history.

(56) References Cited

U.S. PATENT DOCUMENTS

| 6,408,183 | B1 | 6/2002 | Woo |
| 2003/0090998 | A1* | 5/2003 | Lee et al. ...................... 370/229 |
| 2003/0207686 | A1 | 11/2003 | Ramanna et al. |
| 2008/0270274 | A1* | 10/2008 | Mo et al. .......................... 705/34 |

FOREIGN PATENT DOCUMENTS

| JP | 2004235954 A | 8/2004 |
| JP | 2005064961 A | 3/2005 |
| JP | 2005524340 A | 8/2005 |
| JP | 2006500879 A | 1/2006 |

(Continued)

OTHER PUBLICATIONS

Soulhi, 3.: "3G Wireless Networks Provisioning and Monitoring via Policy Based Management," International Conference on Communication Technology Proceedings, 2003, ICCT 2003, vol. 2, pp. 1137-1143, XP010644052, ISBN: 978-7-5635-0686-6, Apr. 9-11, 2003.

(Continued)

*Primary Examiner* — Sam Bhattacharya
(74) *Attorney, Agent, or Firm* — Francois A. Pelaez; Darren M. Simon

(57) ABSTRACT

In a converged communication network, IP data packet services are provided by a core network to access terminals via radio access nodes (RAN). By positioning accounting report triggering closer to the usage, accuracy and comprehensive of accounting is achieved, which can also reduce overhead burdens on the core network. Additional responsibility is given to an access gateway (AGW) between an enhanced base station (eBS) of the RAN and the core network that can reduce the volume and increase the accuracy of accounting message traffic to an authentication, authorization and accounting (AAA) server of the core network. The AGW informs the eBS of accounting rules to be used in making air link records that are merged and formatted in accordance with an accounting protocol for sending to the AAA server, to address duration and volume based accounting needs, postpaid and prepaid accounting types, and user, service and flow based accounting categories.

23 Claims, 6 Drawing Sheets

FOREIGN PATENT DOCUMENTS

| | | | |
|---|---|---|---|
| KR | 20050044805 A | 5/2005 |
| RU | 2129754 C1 | 4/1999 |
| RU | 2190309 | 9/2002 |
| RU | 2207728 C2 | 6/2003 |
| RU | 2273103 C2 | 3/2006 |
| RU | 2295200 C2 | 3/2007 |
| RU | 2297723 C2 | 4/2007 |
| WO | WO9501690 A1 | 1/1995 |
| WO | WO9730556 A2 | 8/1997 |
| WO | WO0001108 A2 | 1/2000 |
| WO | WO0154440 A1 | 7/2001 |
| WO | WO2004036890 A1 | 4/2004 |
| WO | WO2004045140 A1 | 5/2004 |
| WO | WO2004045173 A1 | 5/2004 |
| WO | WO2005043811 A1 | 5/2005 |
| WO | WO2005096547 A1 | 10/2005 |

OTHER PUBLICATIONS

Zseby, et al.: "Policy-Based Accounting," IETF Standard, RFC3334, Internet Engineering Task Force, XP015009098, ISSN: 0000-0003, Oct. 2002.

3GPP2 S.R0037-A v1.0: "IP Network Architecture Model for cdma2000 Spread Spectrum Systems." 3rd Generation Partnership Project 2 "3GPP2," pp. i-50, XP002496074, May 2007.

3GPP2 P.S0001-A; "Wireless IP Network Standard," 3rd Generation Partnership Project 2 "3GPP2." pp. 1-61, XP002258147, Jul. 18, 2001.

International Search Report—PCT/US2008/066794, International Searching Authority—European Patent Office—Sep. 26, 2008.

Written Opinlon—PCT/US2008/066794, International Searching Authority—European Patent Office—Sep. 26, 2008.

* cited by examiner

METHOD AND APPARATUS FOR ACCOUNTING IN A MOBILE DATA PACKET NETWORK

CLAIM OF PRIORITY UNDER 35 U.S.C. §119

The present application for patent claims priority to U.S. Patent Application Ser. No. 60/943,805, entitled "Method and Apparatus for Accounting in UMB/CAN System" filed 13 Jun. 2007, assigned to the assignee hereof and hereby expressly incorporated by reference herein.

FIELD OF INVENTION

The present disclosures pertains to accounting reports and procedures on a data packet network communicating to access terminals over a radio access network, and more particularly to communication systems formed by an access gateway interfacing between a radio access network and an authentication, authorization and accounting (AAA) function of a core network.

BACKGROUND

Mobile communication devices are proliferating in functions and uses, with increasing demands upon communication infrastructures to evolve to meet the demand. Mobile communication devices, also referred to as access terminals and user equipment, continue to merge in capabilities with other types of computing devices such as wireless capable laptop and notebook computers. As such, so called third- and fourth-generation mobile communication systems are moving toward essentially a wireless broadband Internet system with voice and other services built on top. Paying for such wireless communication thus needs to address data packet nature of the usage and the distributed and increasingly flatter architecture. Collecting all of the accounting tracking data in a core network can be disadvantaged in obtaining such usage data accurately and without an undue amount of message traffic.

As depicted in FIG. 1, in a conventional converged communication system 100 having Internet Protocol (IP) services provided by a core network 102, packet data accounting parameters are divided into radio specific parameters collected by a Radio Access Network (RAN) 104 that communicates with end user equipment (access terminals) 106 via an air link 107, and IP network specific parameters collected by a core network function, such as a Serving Packet Data Serving Node (PDSN) 108. The Serving PDSN 108 merges radio specific parameters in interface messages called Air link Records, depicted at 110, from the RAN 104 passed through a packet control function (PCF) 112 with IP network specific parameters to form one or more Usage Data Records (UDR) in accordance with prepaid rules 114 or charging rules 116. Prepaid packet data service allows a user to purchase packet data service in advance based on volume or duration.

After merging the air link records 110, the Serving PDSN 108 uses accounting messages (e.g., RADIUS accounting protocol) to send UDR information, depicted at 118, to a Authentication, Authorization and Accounting (AAA) server 120, which can entail a visited AAA server communicating with a home AAA server, perhaps with a proxy AAA server interfacing there between, for example. The serving PDSN 108 maintains accumulated UDR information until the packet data service is terminated or until the server PDSN 108 receives positive acknowledgment from the AAA server 120 that the AAA server 120 has correctly received the UDR message. For instances in which the AAA server 120 is a visited rather than a home AAA server, the visited AAA server 120 maintains the UDR until the record is delivered to a home AAA server (not shown), or removed by an operator billing system (not shown).

The Packet Data Serving Node, or PDSN, is a component of a CDMA2000 mobile network. It acts as the connection point between the Radio Access and IP networks. This component is responsible for managing point-to-point protocol (PPP) sessions between the mobile provider's core IP network and the mobile station (read mobile phone). The PDSN also provides packet filtering functions and provides QoS connection for IP flows with Access Network. It is similar in function to the GGSN (GPRS Gateway Support Node) that is found in GSM and UMTS networks. The PDSN can be thought of being similar to GGSN in a conceptual sense. Logically, it can also be considered to be a combination of Serving GPRS Support Node (SGSN) and GGSN in the CDMA world. The PDSN provides: (a) Mobility management functions (provided by SGSN in the GPRS/UMTS networks); and (b) Packet routing functionality (provided by GGSN in the GPRS/UMTS networks).

Challenges exist in that the serving PDSN 108 is significantly removed from the communication chain to the access terminal 106. Challenges also exist in that some IP functions of PDSN108 is moved to the radio access network (104) such as packet filtering functions and QoS control function. The usage data of data sent over the air (OTA) 122 that the RAN 104 can monitor is more accurate as compared to data 124 that is often received by the PDSN 108. The conventional PDSN accounting architecture presents issues with regard to accounting accuracy. On forward link with the PDSN counting packets, the data is not sent from the base station to the mobile station due to over-the-air resource constraints, and thus the accounting is inaccurate. In the reverse link, if the data is received from the mobile station to the base station and if the data is lost on backhaul, the reserve data will not be counted by the PDSN even through the air interface has consumed resources.

SUMMARY

The following presents a simplified summary in order to provide a basic understanding of some aspects of the disclosed aspects. This summary is not an extensive overview and is intended to neither identify key or critical elements nor delineate the scope of such aspects. Its purpose is to present some concepts of the described features in a simplified form as a prelude to the more detailed description that is presented later.

In accordance with one or more aspects and corresponding disclosure thereof, various aspects are described in connection with an apparatus and methodology for performing accounting through functionality shared across enhanced base stations (eBSs), an access gateway (AGW), and an accounting server. Accounting in the edge (i.e., the base station) provides for accurate accounting records. In particular, these functions are handled by the eBSs and the AGW to increase accuracy of accounting reporting and reducing an amount of accounting reporting to a core network. These functions distributed to the eBSs and AGWs include measuring and counting of a quantity of data sent and received by an eBS tracked on behalf of an access terminal (AT) or an amount of connected radio air time that an AT uses for a reservation. Creation and management of accounting records are sent to an authentication, authorization and accounting (AAA) server for billing purposes. Assimilation of policy and charging control rules used in the accounting process is performed.

In one aspect, a method prepares usage data record for data packet services to a wireless access terminal. Data packet communication services are provided via an access gateway from a core network to a radio access node for an access terminal. Accounting rules are sent from the access gateway to a base station when the base station becomes a data attachment point for an access terminal or during access authentication and authorization procedures. Air link records are received from the base station at the access gateway in accordance with the accounting rules based upon usage data of the access terminal. The air link records are merged at the access gateway into a usage data record formatted in accordance with an accounting protocol. The usage data record are transmitted from the access gateway to an accounting component of the core network.

In another aspect, at least one processor prepares usage data record for data packet services to a wireless access terminal. A first module provides data packet communication services via an access gateway from a core network to the base station for the access terminal. A second module sends accounting rules from the access gateway to a base station when the base station becomes a data attachment point for an access terminal or during access authentication and authorization procedures. A third module receives air link records from the base station at the access gateway in accordance with the accounting rules based upon usage data of the access terminal. A fourth module merges the air link records at the access gateway into a usage data record formatted in accordance with an accounting protocol. A fifth module transmits the usage data record from the access gateway to an accounting component of the core network.

In an additional aspect, a computer program product prepares usage data record for data packet services to a wireless access terminal. A computer-readable storage medium comprises sets of codes for causing a computer to perform the afore-mentioned method.

In another additional aspect, an apparatus prepares usage data record for data packet services to a wireless access terminal. Means are provided for providing data packet communication services via an access gateway from a core network to the base station for the access terminal. Means are provided for sending accounting rules from the access gateway to a base station when the base station becomes a data attachment point for an access terminal or during access authentication and authorization procedures. Means are provided for receiving air link records from the base station at the access gateway in accordance with the accounting rules based upon usage data of the access terminal. Means are provided for merging the air link records at the access gateway into a usage data record formatted in accordance with an accounting protocol. Means are provided for transmitting the usage data record from the access gateway to an accounting component of the core network.

In a further aspect, an access gateway prepares usage data record for data packet services to a wireless access terminal. A communication component provides data packet communication services from a core network to a base station for an access terminal. A processor sends accounting rules to the base station via the communication component when the base station becomes a data attachment point for the access terminal. A memory stores air link records from the base station created in accordance with the accounting rules based upon usage data of the access terminal. The processor merges the air link records into a usage data record formatted in accordance with an accounting protocol. The communication component transmits the usage data record to an accounting component of the core network.

To the accomplishment of the foregoing and related ends, one or more aspects comprise the features hereinafter fully described and particularly pointed out in the claims. The following description and the annexed drawings set forth in detail certain illustrative aspects and are indicative of but a few of the various ways in which the principles of the aspects may be employed. Other advantages and novel features will become apparent from the following detailed description when considered in conjunction with the drawings and the disclosed aspects are intended to include all such aspects and their equivalents.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

In a converged communication network, a core network provides Internet protocol (IP) data packet services to access terminals via radio access nodes (RAN). By positioning accounting report triggering closer to the usage by the access terminal, accuracy and comprehensive of accounting is achieved, which can also reduce overhead burdens on the core network. In particular, additional responsibility is given to an access gateway (AGW) between an enhanced base station (eBS) of the RAN and the core network that can reduce the volume and increase the accuracy of accounting message traffic to an authentication, authorization and accounting (AAA) server of the core network. The AGW informs the eBS of accounting rules to be used in making air link records that are merged and formatted in accordance with an accounting protocol for sending to the AAA server. Different types of accounting needs are supported and enhanced by the AGW/RAN, including duration based accounting (e.g., VoIP, video telephony, etc.), volume based accounting (e.g., HTTP, FTP, etc.). Different types of accounting are supported, including postpaid and prepaid. Different accounting categories are supported by the AGW/RAN, including user based accounting, serve based accounting, and flow based accounting. Different accounting protocols can be supported by the AGW/RAN, including DIAMETER protocol or RADIUS protocol.

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to facilitate describing these aspects.

Figure 1:
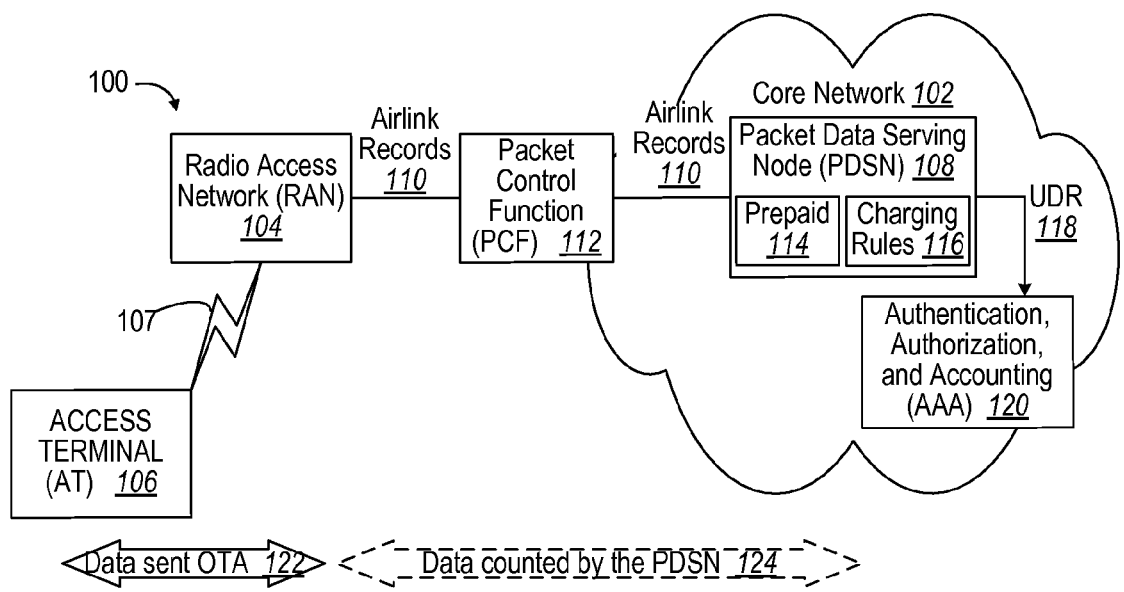
FIG. 1 illustrates a block diagram of a conventional converged communication system for providing IP data packet services from a core network to an access terminal (AT) over a radio access network (RAN) with remote address based accounting merged at a core function with incomplete or inaccurate air link records.
Figure 2:
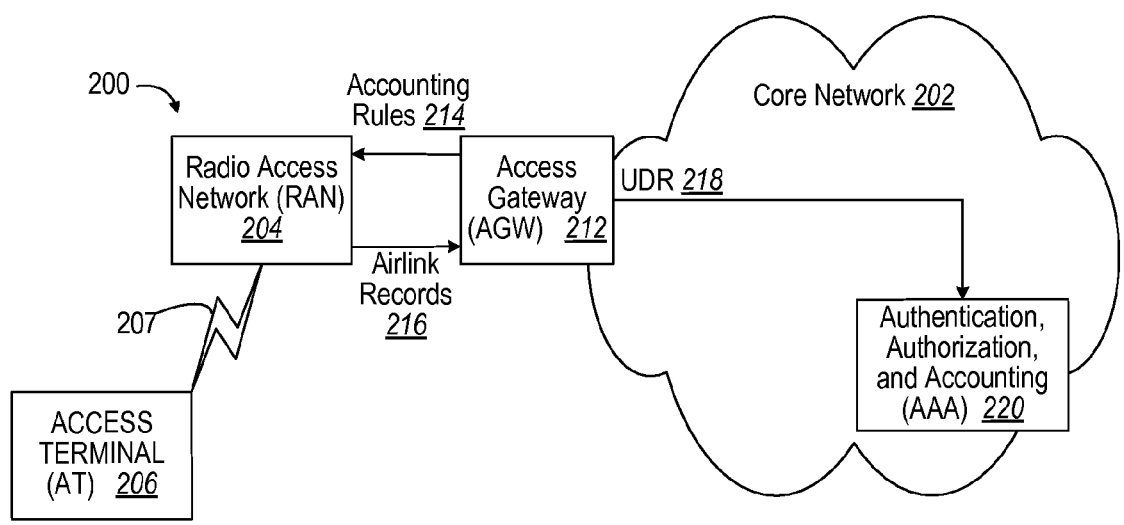
FIG. 2 illustrates a block diagram of an exemplary converged communication system having an access gateway (AGW) that performs the merging of air link records into a usage data record formatted in an accounting protocol.

Turning to the Drawings, in FIG. 2, a converged communication system 200 provides IP data packet service from a core network 202 to a radio access network 204 for an access terminal (AT) 206 via an air link 207. An access gateway (AGW) 212 provides accounting rules 214 to the RAN 204, which in turn provides air link records 216 regarding data packet usage by the AT 206. The AGW 212 merges the air link records 216 in a usage data record 218 formatted in accordance with an accounting protocol (e.g., Diameter, RADIUS, etc.) and transmitted to an authentication, authorization, and accounting (AAA) server 220.

The AGW 212 provides this functionality with one or more eBS 204 that in turn provide various functions. A forward-link serving eBS (FLSE) is a serving eBS 204 for the forward-link physical layer. A reverse-link serving eBS (RLSE) is a serving eBS 204 for the reverse-link physical layer. A signaling radio network controller (SRNC) is a session anchor eBS 206 that stores the session information for the AT 206 and serves as a permanent route to the AT. A data attachment point (DAP) is a receiving eBS for all the data packets from the AGW. Additionally, an eBS can have visibility into the user's IP packets, perform packet filtering, and can optimize over-the-air (OTA) scheduling or perform other value-added functions.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDMR, etc. UTRA and E-UTRA are part of Universal Mobile Telecommunication System (UMTS). 3GPP Long Term Evolution (LTE) is an upcoming release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). CDMA2000 and UMB are described in documents from an organization named "3rd Generation Partnership Project 2" (3GPP2). These various radio technologies and standards are known in the art.

Figure 3:
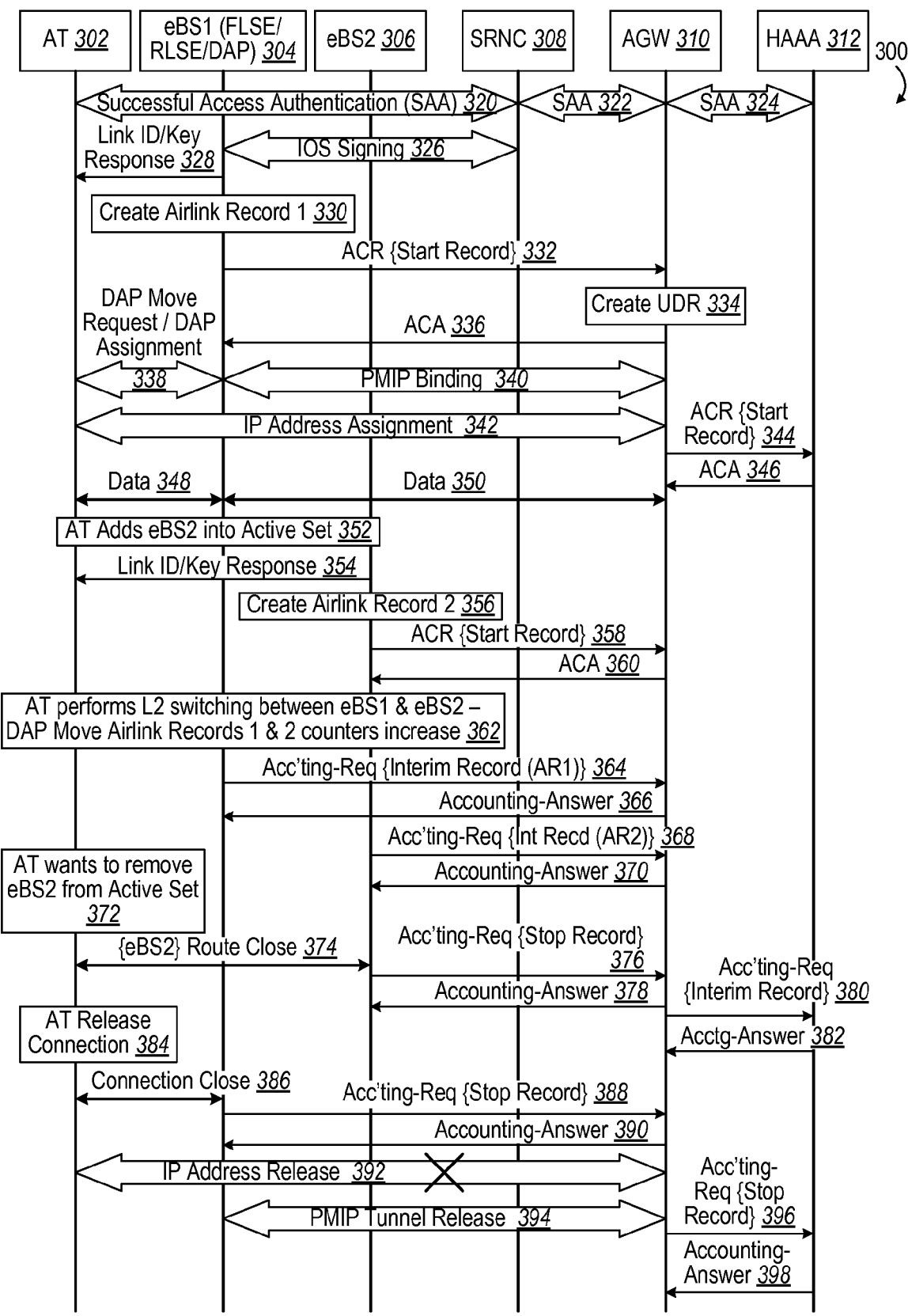
FIG. 3 illustrates a timing diagram of a methodology for an AGW to perform merging of air link records into a usage data record formatted in an accounting protocol.
Figure 5:
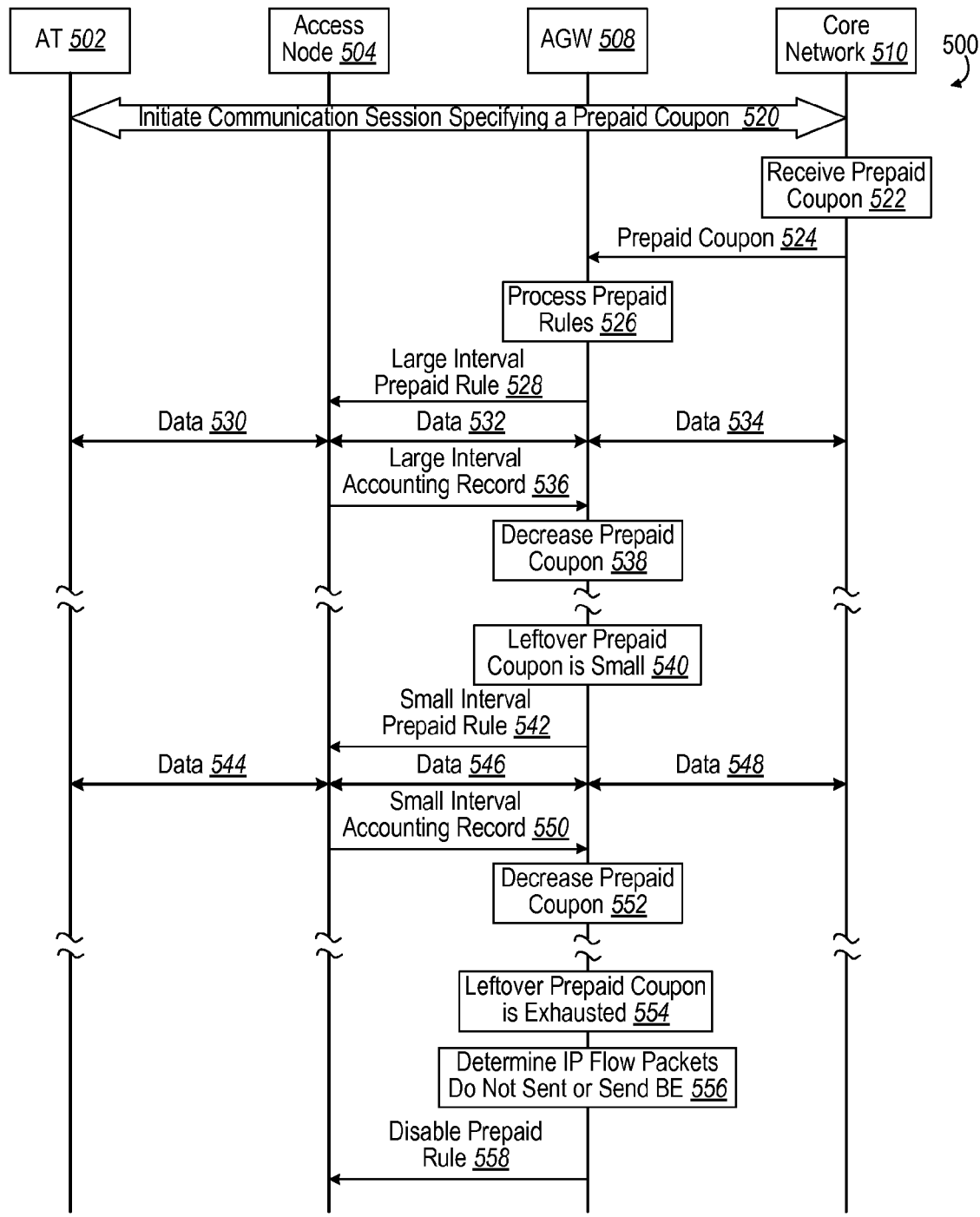
FIG. 5 illustrates a timing diagram of a methodology for the RAN and AGW to monitor prepaid coupon use.

FIGS. 3 and 5 illustrate methodologies and/or flow diagrams in accordance with the claimed subject matter. For simplicity of explanation, the methodologies are depicted and described as a series of acts. It is to be understood and appreciated that the subject technology is not limited by the acts illustrated and/or by the order of acts. For example, acts can occur in various orders and/or concurrently, and with other acts not presented and described herein. Furthermore, not all illustrated acts may be required to implement the methodologies in accordance with the claimed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring now to FIG. 3, a methodology 300 provides enhanced accounting for data packet usage data for an access terminal (AT) 302 to an enhanced base station 1 (eBS1) 304, that serves as the FLSE, RLSE and DAP, and on occasion to an eBS2 306, with a session maintained by an SRNC 308. An access gateway (AGW) 310 coordinates between these radio access network (RAN) elements and a home AAA server 312 of the core network. The AT 302 performs successful Extensible Authentication Protocol (EAP), a transport protocol for different authentication algorithms, access authentication and authorization with the SRNC 308, which in turn entails successful access authentication as depicted at 322 with the AGW 310 and the HAAA 312 as depicted at 324.

The AT 302 adds eBS1 304 in the Route Set and triggers online/offline signature scheme (IOS) signaling exchanged between eBS1 304 and the SRNC 308 as depicted at 326. The SRNC 308 sends session information to eBS1 304. As depicted at 328, the eBS1 304 sends Link ID to the AT 302. At this time, eBS1 304 serves as both FLSE (Forward Link Serving eBS) and RLSE (Reverse Link Serving eBS). At 330, the eBS1 304 creates an air link record. At 332, the eBS1 304 sends an accounting request (ACR) {Start Record} to the AGW 310. At 334, the AGW 310 creates a UDR for AT's IP address. At 336, the AGW 310 sends an accounting answer (ACA). At 338, the AT 302 requests eBS1 304 to be the DAP (Data Attachment Point) or the network decides that eBS1 304 should be DAP. At 340, the eBS1 304 triggers the primary proxy mobile IP (PMIP) tunnel establishment between eBS1 304 and AGW 310. At 342, the AT 302 and AGW 310 perform IP address assignment. At 344, the AGW 310 sends Accounting-Request (Start) including the created UDR to the HAAA 312. At 346, the HAAA sends Accounting-Response to the AGW. At 348, data can flow between AT 302 and eBS1 304, and in turn at 350 at AGW 310.

The UDR format with regard to communication from the eBS (air link) can comprise a user identifier, such as NAI (Network Access Identifier), infrastructure identifiers, such as ANID (anonymous ID), common session activity data, such as event time and total active connection time, and flow activity data, such as event time, reservation label, packet filters, data octet count for origination, data octet count for termination, granted quality of service (QoS), and reservation used time.

The UDR format with regard to the AGW can comprise user identifiers, such as NAI and IP address, infrastructure identifiers, such as carrier ID, AGW address, foreign agent (FA) address, and home agent (HA) address, a common session activity, such as event time, total data session time, inbound common management information protocol (CMIP) signaling octet count, outbound CMIP signaling octet count, filtered octet count at origination, and filtered octet count at termination, and an access node record, such an anonymous identifier and a flow activity, such as an event time, reservation label, packet filters, data octet count at origination, data octet count at termination, granted quality of service, and reservation used time.

It should be appreciated that prepaid coupons can be implemented by the AGW 310 without requiring to perform packet filtering.

At 352, the AT 302 adds an eBS2 306 into the Route Set. The eBS2 306 gets session information from the SRNC 308 through IOS signaling. At 354, the eBS2 306 sends Link ID to the AT 302. At 356, the eBS2 306 creates an air link record 2. In one aspect as depicted, it is desirable for accounting start and stop to come from the same eBS. When an eBS is added in the Route Set, that eBS sends an Account Start to the AGW 310, as depicted at 358, which results in the AGW 310 responding with an Accounting Answer at 360. As will be described below, when an eBS is dropped from the Route Set, the eBS sends an Account Stop to the AGW 310, which is not event trigger. Alternatively, the steps depicted at 358 and 360 can be omitted when an accounting start can come from one eBS and accounting start can come from another eBS.

At block 362, the AT 302 performs L2 switching and DAP move between eBS1 304 and eBS2 306. At 364, the eBS1 304 sends an accounting-request {interim Record 1 (AR1)} to the AGW 310, which in turn responds with an ACA at 366. At 368, the eBS2 306 also sends an accounting request {interim record (AR2)} at 370.

Sometime later, the AT 302 wants to remove eBS2 306 from the Route Set, as depicted at 372. The AT 302 and eBS2 306 perform Route Close procedures at 374, which prompts the eBS2 306 to send an ACR {Stop Record} at 376 to the AGW 310, which responds with an ACA at 378.

The AGW 310 can send interim accounting report to the HAAA 312 periodically, as depicted at 380, which responds with an ACA at 382. The interim accounting period is based on the interim interval parameter received from HAAA 312 via EAP Access Authentication and Authorization procedures or is based on local policy if interim-interval parameter is not received from HAAA 312.

Sometime later, the AT 302 releases the connection at block 384. At 386, the AT 302 and eBS1 304 perform connection close procedures, prompting the eBS1 304 to send an ACR {Stop Record} at 388 to the AGW 310, which responds with an ACA at 390. Two scenarios can occur. In a first scenario as depicted, the IP address is released at block 392 before the Primary PMIP Tunnel is released at block 394. Sometime later, the AT's IP address is released. In a second scenario that is not depicted, the Primary PMIP Tunnel is released before IP address is released. At 396, the AGW 310 sends the Accounting Stop to the HAAA 312 for each IP session accounting. At 398, the HAAA 312 sends the Accounting Response to the AGW 310.

Figure 4:
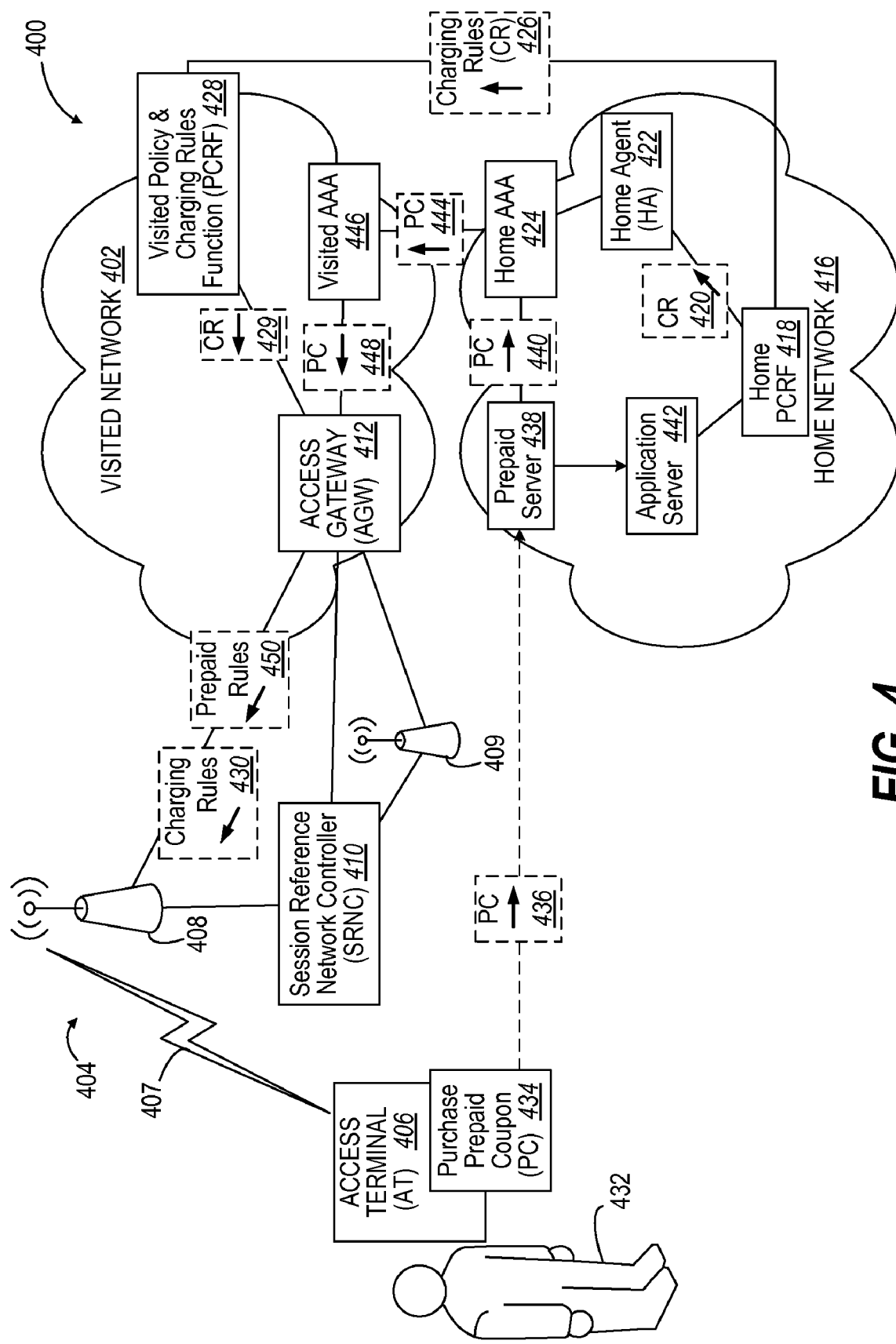
FIG. 4 illustrates a block diagram of another exemplary converged communication system of FIG. 2 extended to address a core network of both a visited and home network including use of prepaid coupons.

Referring to FIG. 4, another exemplary converged communication system 400 provides IP data packet service from a visited core network 402 to a radio access network 404 for an access terminal (AT) 406 via an air link 407. The AT 406 maintains the air link 407 with an eBS1 408, an eBS2 409 and an SRNC 410 as the RAN 404 that interacts through an access gateway (AGW) 412 to accounting reporting. In particular, the illustrative communication system 400 further includes a home core network 416 that provides multiple payment types, including prepaid and postpaid.

For postpaid data packet services, a home Policy Charging Rules Function (PCRF) 418 provides charging rules 420 to a home agent 422 and then to a home AAA server 424. The home PCRF 418 also provides charging rules 426 to a visited PCRF 428 and then in turn at 429 to the visited AGW 412, both of the visited core network 402. The AGW 412 can then prepare charging rules 430 to the eBS1 408.

A user 432 purchases a prepaid coupon, as depicted at 434, that is communicated as prepaid coupon (PC) information 436 to a prepaid server 438 of the home core network 416, which in turn provides PC information 440 to the home AAA server 424. The prepaid server 438 communicates with an application server 442 that communicates with the home PCRF 416. The home AAA server 424 communicates PC information 444 to a visited AAA server 446 of the visited core network 402. The visited AAA server 446 sends PC information 448 to the visited AGW 412 that prepares prepaid rules 450 for the eBS1 408.

Referring to FIG. 5, a methodology 500 for accounting data usage by an AT 502 by an access node 504 and AGW 508 to report to a core network 510, which includes an AAA function. At 520, the AT initiates a communication session specifying or associated with a prepaid coupon. At this point or previously, the core network 510 receives the prepaid coupon at 522. The prepaid coupon information is relayed to the AGW 508 at 524, which in turn processes prepaid rules 526 for transmission at 528 as large interval prepaid rule to the access node (AN) 504. Data can then be exchanged utilizing this prepaid authorization between the AT 502 and AN 504 at 530, between the AN 504 and AGW 508 at 532, and between the AGW 508 and the core network 510 at 534. In accordance with the large interval prepaid rule, the AN 504 sends a large interval accounting record at 536 to the AGW 508. The AGW 508 decreases the prepaid coupon at 538 as a leftover coupon. After some iterations of this accounting reporting, the AGW 508 determines at 540 that the leftover prepaid coupon is now small (e.g., 10% remaining, 1 minute remaining, $1 remaining, etc.). In response, the AGW 508 sends a small interval prepaid rule 542 to the AN 504. Data can then continue to be exchanged between the AT 502 and AN 504 at 544, between the AN 504 and AGW 508 at 546, and between the AGW 508 and the core network 510 at 548. In accordance with the small interval prepaid rule, the AN 504 sends a small interval accounting record at 550 to the AGW 508. The AGW 508 decreases the prepaid coupon at 552. After some iterations of this accounting reporting, the AGW 508 determines at 554 that the leftover prepaid coupon is now exhausted. The AGW 508 makes a determination as to whether IP flow packets are not to be sent or to be sent as block error (BE) at 556 and then sends this disabling prepaid rule at 558 to the AN 504.

Figure 6:
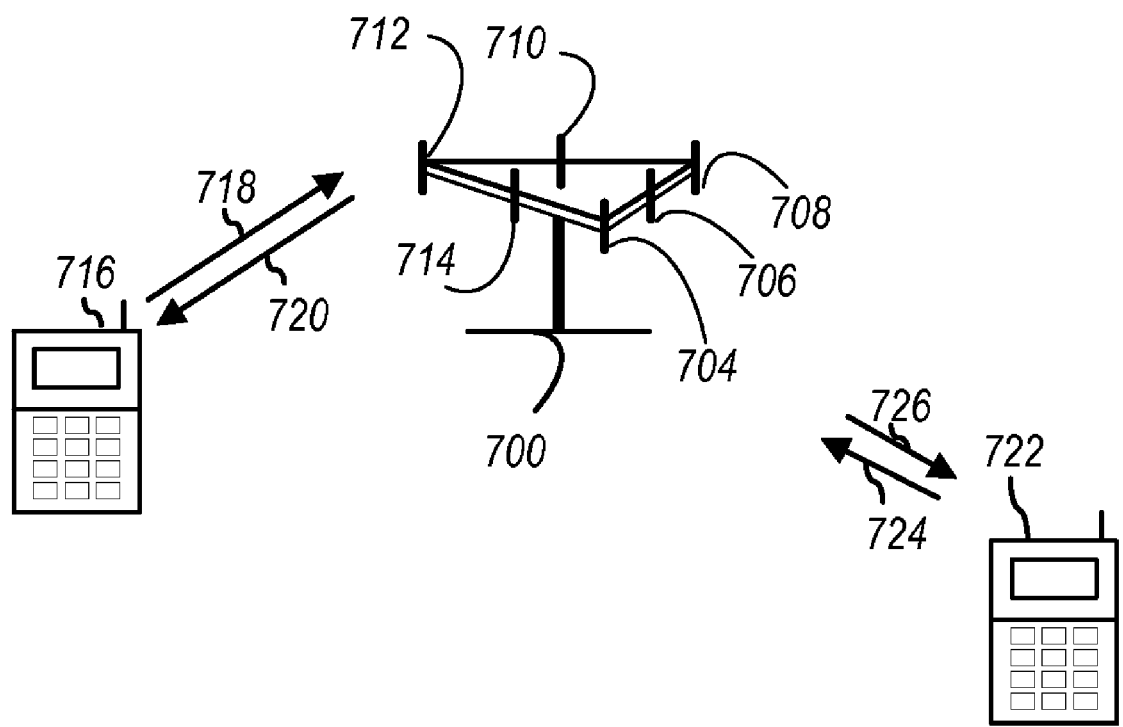
FIG. 6 illustrates a schematic diagram of a multiple access wireless communication system according to one aspect.

Referring to FIG. 6, a multiple access wireless communication system according to one aspect is illustrated. An access point 700 (AP) includes multiple antenna groups, one including 704 and 706, another including 708 and 710, and an additional including 712 and 714. In FIG. 6, only two antennas are shown for each antenna group, however, more or fewer antennas may be utilized for each antenna group. Access terminal 716 (AT) is in communication with antennas 712 and 714, where antennas 712 and 714 transmit information to access terminal 716 over forward link 720 and receive information from access terminal 716 over reverse link 718. Access terminal 722 is in communication with antennas 706 and 708, where antennas 706 and 708 transmit information to access terminal 722 over forward link 726 and receive information from access terminal 722 over reverse link 724. In a FDD system, communication links 718, 720, 724 and 726 may use different frequency for communication. For example, forward link 720 may use a different frequency then that used by reverse link 718.

Each group of antennas and/or the area in which they are designed to communicate is often referred to as a sector of the access point. In the aspect, antenna groups each are designed to communicate to access terminals in a sector of the areas covered by access point 700.

In communication over forward links 720 and 726, the transmitting antennas of access point 700 utilize beam forming in order to improve the signal-to-noise ratio of forward links for the different access terminals 716 and 724. In addition, an access point using beam forming to transmit to access terminals scattered randomly through its coverage causes less interference to access terminals in neighboring cells than an access point transmitting through a single antenna to all its access terminals.

An access point may be a fixed station used for communicating with the terminals and may also be referred to as an access point, a Node B, or some other terminology. An access terminal may also be called user equipment (UE), a wireless communication device, terminal, or some other terminology.

Figure 7:
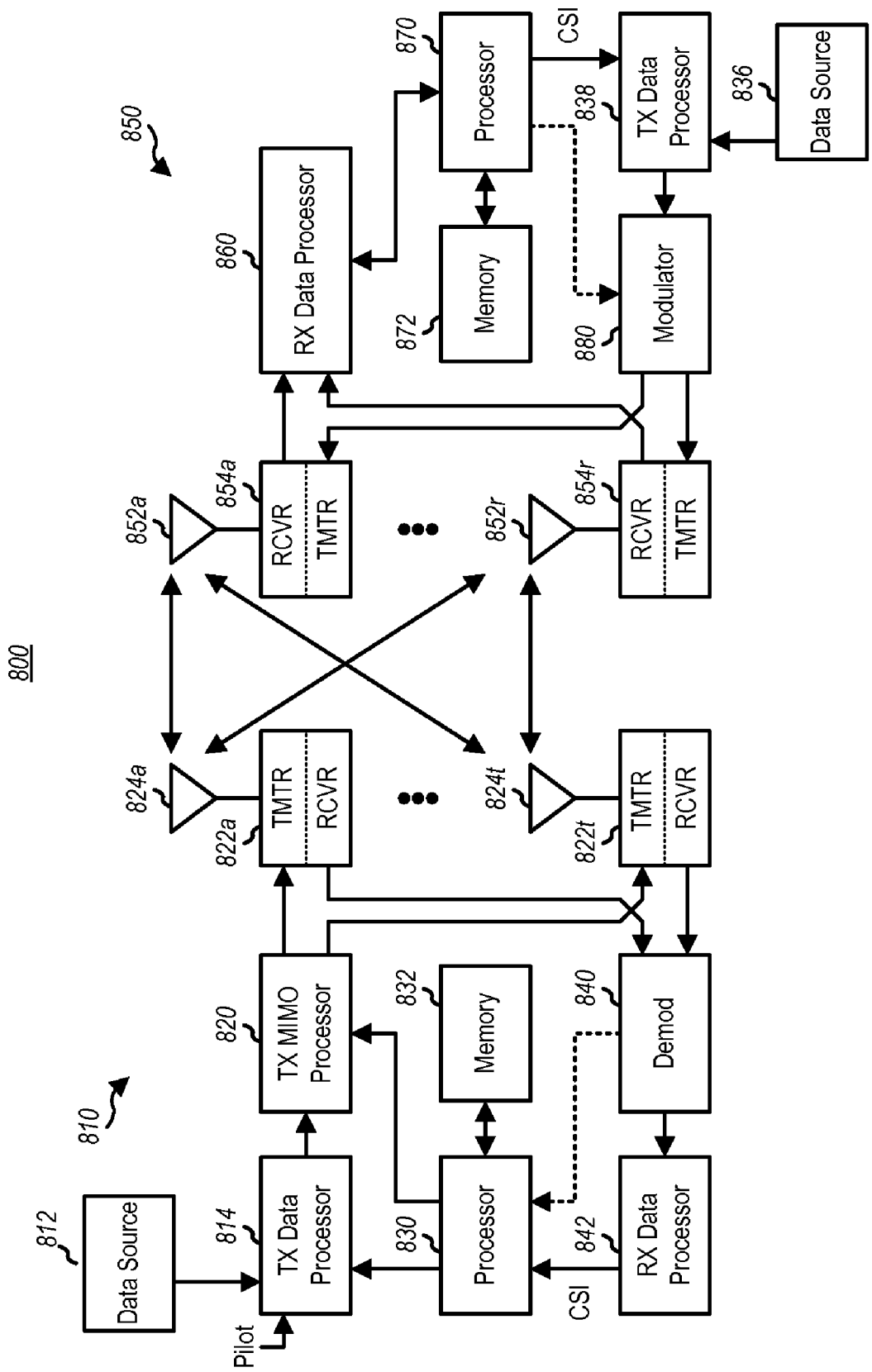
FIG. 7 illustrates a block diagram of a communication system.

FIG. 7 is a block diagram of an aspect of a transmitter system 810 (also known as the access point) and a receiver system 850 (also known as access terminal) in a MIMO system 800. At the transmitter system 810, traffic data for a number of data streams is provided from a data source 812 to a transmitter (TX) data processor 814.

In an aspect, each data stream is transmitted over a respective transmit antenna. TX data processor 814 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 830.

The modulation symbols for all data streams are then provided to a TX MIMO processor 820, which may further process the modulation symbols (e.g., for OFDM). TX MIMO processor 820 then provides $N_T$ modulation symbol streams to $N_T$ transmitters (TMTR) 822a through 822t. In certain implementations, TX MIMO processor 820 applies beam-forming weights to the symbols of the data streams and to the antenna from which the symbol is being transmitted.

Each transmitter 822 receives and processes a respective symbol stream to provide one or more analog signals, and further conditions (e.g., amplifies, filters, and up converts) the analog signals to provide a modulated signal suitable for transmission over the MIMO channel. $N_T$ modulated signals from transmitters 822a through 822t are then transmitted from $N_T$ antennas 824a through 824t, respectively.

At receiver system 850, the transmitted modulated signals are received by $N_R$ antennas 852a through 852r and the received signal from each antenna 852 is provided to a respective receiver (RCVR) 854a through 854r. Each receiver 854 conditions (e.g., filters, amplifies, and down converts) a respective received signal, digitizes the conditioned signal to provide samples, and further processes the samples to provide a corresponding "received" symbol stream.

An RX data processor 860 then receives and processes the $N_R$ received symbol streams from $N_R$ receivers 854 based on a particular receiver processing technique to provide $N_T$ "detected" symbol streams. The RX data processor 860 then demodulates, deinterleaves, and decodes each detected symbol stream to recover the traffic data for the data stream. The processing by RX data processor 860 is complementary to that performed by TX MIMO processor 820 and TX data processor 814 at transmitter system 810.

A processor 870 periodically determines which pre-coding matrix to use (discussed below). Processor 870 formulates a reverse link message comprising a matrix index portion and a rank value portion.

The reverse link message may comprise various types of information regarding the communication link and/or the received data stream. The reverse link message is then processed by a TX data processor 838, which also receives traffic data for a number of data streams from a data source 836, modulated by a modulator 880, conditioned by transmitters 854a through 854r, and transmitted back to transmitter system 810.

At transmitter system 810, the modulated signals from receiver system 850 are received by antennas 824, conditioned by receivers 822, demodulated by a demodulator 840, and processed by a RX data processor 842 to extract the reserve link message transmitted by the receiver system 850. Processor 830 then determines which pre-coding matrix to use for determining the beam forming weights then processes the extracted message.

What has been described above includes examples of the various aspects. It is, of course, not possible to describe every conceivable combination of components or methodologies for purposes of describing the various aspects, but one of ordinary skill in the art may recognize that many further combinations and permutations are possible. Accordingly, the subject specification intended to embrace all such alterations, modifications, and variations that fall within the spirit and scope of the appended claims.

As used in this application, the terms "component", "module", "system", and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

The word "exemplary" is used herein to mean serving as an example, instance, or illustration. Any aspect or design described herein as "exemplary" is not necessarily to be construed as preferred or advantageous over other aspects or designs.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects. In this regard, it will also be recognized that the various aspects include a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. To the extent that the terms "includes," and "including" and variants thereof are used in either the detailed description or the claims, these terms are intended to be inclusive in a manner similar to the term "comprising." Furthermore, the term "or" as used in either the detailed description of the claims is meant to be a "non-exclusive or".

Furthermore, as will be appreciated, various portions of the disclosed systems and methods may include or consist of artificial intelligence, machine learning, or knowledge or rule based components, sub-components, processes, means, methodologies, or mechanisms (e.g., support vector machines, neural networks, expert systems, Bayesian belief networks, fuzzy logic, data fusion engines, classifiers . . . ). Such components, inter alia, can automate certain mechanisms or processes performed thereby to make portions of the systems and methods more adaptive as well as efficient and intelligent.

In view of the exemplary systems described supra, methodologies that may be implemented in accordance with the disclosed subject matter have been described with reference to several flow diagrams. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described herein. Additionally, it should be further appreciated that the methodologies disclosed herein are capable of being stored on an article of manufacture to facilitate transporting and transferring such methodologies to computers. The term article of manufacture, as used herein, is intended to encompass a computer program accessible from any computer-readable device, carrier, or media.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein, will only be incorporated to the extent that no conflict arises between that incorporated material and the existing disclosure material.

What is claimed is:

1. A method for preparing a usage data record for data packet services to a wireless access terminal, comprising:
providing data packet communication services via an access gateway from a core network to a base station for the access terminal;
sending accounting rules from the access gateway to the base station when the base station becomes a data attachment point for the access terminal or during access authentication and authorization, wherein the accounting rules include rules for postpaid charging;
receiving air link records from the base station at the access gateway in accordance with the accounting rules based upon usage data of the access terminal;
merging the air link records at the access gateway into a usage data record formatted in accordance with an accounting protocol; and
transmitting the usage data record from the access gateway to an accounting component of the core network.

2. The method of claim 1, further comprising sending accounting rules for prepaid charging to the base station.

3. The method of claim 2, further comprising determining a size of the prepaid charging and adjusting an air link reporting interval for the base station in relation to the size.

4. The method of claim 1, further comprising transmitting an interim usage data record from the base station to the access gateway or from the access gateway to the accounting component.

5. The method of claim 1, further comprising:
facilitating the access terminal adding a second base station to a route set; and
merging air link records based on air link messages comprised of an accounting request start record from the first base station and a stop record from the second base station.

6. The method of claim 1, further comprising:
facilitating the access terminal adding a second base station to a route set; and
merging air link records based on air link messages comprised of an accounting request start record and a stop record from the first base station.

7. The method of claim 1, further comprising receiving air link record from the base station comprising a user identifier, infrastructure identifiers, common session activity data, and flow activity data.

8. The method of claim 7, wherein the user identifier comprises a network access identifier, the infrastructure identifiers comprise an anonymous identifier, the common session activity data comprises event time and total active connection time, and the flow activity data comprises event time, reservation label, packet filters, data octet count for origination, data octet count for termination, granted quality of service (QoS), and reservation used time.

9. The method of claim 1, further comprising merging air link records into a usage data record comprising user identifiers, infrastructure identifiers, common session activity, and access node record.

10. The method of claim 9, wherein the user identifiers comprise network access identifier and Internet Protocol (IP) IP address, infrastructure identifiers comprise carrier identifier, access gateway address, foreign agent (FA) address, and home agent (HA) address, the common session activity comprises event time, total data session time, inbound common management information protocol (CMIP) signaling octet count, outbound CMIP signaling octet count, filtered octet count at origination, and filtered octet count at termination, and the access node record comprises an anonymous identifier and a flow activity comprising an event time, reservation label, packet filters, data octet count at origination, data octet count at termination, granted quality of service, and reservation used time.

11. At least one processor for preparing usage data record for data packet services to a wireless access terminal, comprising:
a first module for providing data packet communication services via an access gateway from a core network to a base station for the access terminal;
a second module for sending accounting rules from the access gateway to the base station when the base station becomes a data attachment point for the access terminal, wherein the accounting rules include rules for postpaid charging;
a third module for receiving air link records from the base station at the access gateway in accordance with the accounting rules based upon usage data of the access terminal;
a fourth module for merging the air link records at the access gateway into a usage data record formatted in accordance with an accounting protocol; and
a fifth module for transmitting the usage data record from the access gateway to an accounting component of the core network.

12. A computer program product for preparing usage data record for data packet services to a wireless access terminal, comprising:
a non-transitory computer-readable storage medium, comprising:
a first set of codes for causing a computer to provide data packet communication services via an access gateway from a core network to a base station for the access terminal;
a second set of codes for causing the computer to send accounting rules from the access gateway to the base station when the base station becomes a data attachment point for the access terminal, wherein the accounting rules include rules for postpaid charging;
a third set of codes for causing the computer to receive air link records from the base station at the access gateway in accordance with the accounting rules based upon usage data of the access terminal;
a fourth set of codes for causing the computer to merge the air link records at the access gateway into a usage data record formatted in accordance with an accounting protocol; and
a fifth set of codes for causing the computer to transmit the usage data record from the access gateway to an accounting component of the core network.

13. An apparatus for preparing a usage data record for data packet services to a wireless access terminal, comprising:
means for providing data packet communication services via an access gateway from a core network to a base station for the access terminal;
means for sending accounting rules from the access gateway to the base station when the base station becomes a data attachment point for the access terminal, wherein the accounting rules include rules for postpaid charging;
means for receiving air link records from the base station at the access gateway in accordance with the accounting rules based upon usage data of the access terminal;
means for merging the air link records at the access gateway into a usage data record formatted in accordance with an accounting protocol; and
means for transmitting the usage data record from the access gateway to an accounting component of the core network.

14. An access gateway for preparing a usage data record for data packet services to a wireless access terminal, comprising:
a communication component configured to provide data packet communication services from a core network to a base station for an access terminal;
a processor configured to send accounting rules to the base station via the communication component when the base station becomes a data attachment point for the access terminal, wherein the accounting rules include rules for postpaid charging;
a memory configured to store air link records from the base station created in accordance with the accounting rules based upon usage data of the access terminal;
the processor further configured to merge the air link records into a usage data record formatted in accordance with an accounting protocol; and
the communication component further configured to transmit the usage data record to an accounting component of the core network.

15. The access gateway of claim 14, wherein the processor is further configured to send accounting rules for prepaid charging to the base station.

16. The access gateway of claim 15, wherein the processor is further configured to determine a size of the prepaid charging and to adjust an air link reporting interval for the base station in relation to the size.

17. The access gateway of claim 14, wherein the processor is further configured to transmit an interim usage data record from the access gateway to the accounting component.

18. The access gateway of claim 14, wherein the processor is further configured to:
facilitate the access terminal adding a second base station to a route set; and
merge air link records based on air link messages comprised of an accounting request start record from the first base station and a stop record from the second base station.

19. The access gateway of claim 14, wherein the processor is further configured to:
facilitate the access terminal adding a second base station to a route set; and
merge air link records based on air link messages comprised of an accounting request start record and a stop record from the first base station.

20. The access gateway of claim 14, wherein the processor is further configured to receive air link records from the base station comprising a user identifier, infrastructure identifiers, common session activity data, and flow activity data.

21. The access gateway of claim 20, wherein the user identifier comprises a network access identifier, the infrastructure identifiers comprise an anonymous identifier, the common session activity data comprises event time and total active connection time, and the flow activity data comprises event time, reservation label, packet filters, data octet count for origination, data octet count for termination, granted quality of service (QoS), and reservation used time.

22. The access gateway of claim 14, wherein the processor is further configured to merge air link records into a usage data record comprising user identifiers, infrastructure identifiers, common session activity, and access node record.

23. The access gateway of claim 22, wherein the user identifiers comprise network access identifier and Internet Protocol (IP) IP address, infrastructure identifiers comprise carrier identifier, access gateway address, foreign agent (FA) address, and home agent (HA) address, the common session activity comprises event time, total data session time, inbound common management information protocol (CMIP) signaling octet count, outbound CMIP signaling octet count, filtered octet count at origination, and filtered octet count at termination, and the access node record comprises an anonymous identifier and a flow activity comprising an event time, reservation label, packet filters, data octet count at origination, data octet count at termination, granted quality of service, and reservation used time.

* * * * *